US008993209B2

(12) United States Patent
Kim et al.

(10) Patent No.: US 8,993,209 B2
(45) Date of Patent: Mar. 31, 2015

(54) POSITIVE-TYPE PHOTOSENSITIVE RESIN COMPOSITION AND BLACK BANK OF AN ORGANIC LIGHT-EMITTING DEVICE INCLUDING SAME

(75) Inventors: Sang-Woo Kim, Daejeon (KR); Se-Jin Shin, Daejeon (KR); Kyung-Jun Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/810,131

(22) PCT Filed: Jul. 12, 2011

(86) PCT No.: PCT/KR2011/005106
§ 371 (c)(1),
(2), (4) Date: Mar. 18, 2013

(87) PCT Pub. No.: WO2012/008736
PCT Pub. Date: Jan. 19, 2012

(65) Prior Publication Data
US 2013/0189623 A1 Jul. 25, 2013

(30) Foreign Application Priority Data

Jul. 14, 2010 (KR) .................. 10-2010-0067852
Jul. 14, 2010 (KR) .................. 10-2010-0067919

(51) Int. Cl.
| | | |
|---|---|---|
| G03F 7/023 | (2006.01) | |
| G03F 7/30 | (2006.01) | |
| H01L 51/50 | (2006.01) | |
| G03F 7/004 | (2006.01) | |
| G03F 7/20 | (2006.01) | |
| H01L 27/32 | (2006.01) | |
| H01L 51/52 | (2006.01) | |
| H01L 51/00 | (2006.01) | |

(52) U.S. Cl.
CPC .............. *G03F 7/004* (2013.01); *G03F 7/0045* (2013.01); *G03F 7/0233* (2013.01); *H01L 27/3246* (2013.01); *H01L 51/5284* (2013.01); *G03F 7/20* (2013.01); *H01L 51/0018* (2013.01); *H01L 27/3251* (2013.01)
USPC ........... 430/192; 430/190; 430/311; 430/326; 430/320

(58) Field of Classification Search
None
See application file for complete search history.

(56) References Cited

U.S. PATENT DOCUMENTS

| | | | | |
|---|---|---|---|---|
| 4,557,996 | A * | 12/1985 | Aoyama et al. | ............... 430/324 |
| 4,927,736 | A | 5/1990 | Mueller et al. | |
| 5,288,588 | A | 2/1994 | Yukawa et al. | |
| 6,194,837 | B1 * | 2/2001 | Ozawa | .................. 315/169.1 |
| 6,333,142 | B1 * | 12/2001 | Toyoda et al. | ................. 430/320 |
| 7,230,592 | B2 * | 6/2007 | Sato et al. | ........................ 345/76 |
| 2004/0048188 | A1 | 3/2004 | Hatanaka et al. | |
| 2004/0197703 | A1 | 10/2004 | Miyoshi et al. | |
| 2005/0153238 | A1 | 7/2005 | Honda et al. | |
| 2006/0110680 | A1 | 5/2006 | Taniguchi et al. | |

FOREIGN PATENT DOCUMENTS

| | | | |
|---|---|---|---|
| CN | 1536442 | A | 10/2004 |
| CN | 1782875 | A | 6/2006 |
| JP | 1989060630 | A | 3/1989 |
| JP | 2002116541 | A | 4/2002 |
| JP | 2003-119381 | A * | 4/2003 |
| JP | 2004-326094 | A | 11/2004 |
| JP | 2005099138 | A | 4/2005 |
| JP | 2005196130 | A | 7/2005 |
| JP | 2009-031344 | A | 2/2009 |
| KR | 10-0123891 | B1 | 11/1997 |
| KR | 10-0148011 | B1 | 8/1998 |
| KR | 10-2009-0063543 | A | 6/2009 |

OTHER PUBLICATIONS

Derwent-ACC-No. 2004-125557, English abstract of JP 2003119381A, Ando et al, Derwent Information LTD, from Derwent Week—200413, 4 pages printed Sep. 21, 2013 from Derwent file of East database.*
English translation of JP, 2003-119381, A (2003) from machine translation from AIPN Japan Patent Office National Center for Industrial Property Information and Training, generated Sep. 21, 2013, 13 pages.*
CAS Registry No. 68510-93-0, in search for nt-200, obtained from SciFlnder database Sep. 21, 2013, American Chemical Society, CAS registry files, 2 pages.*
Korean Office Action issued in Korean Patent Application No. 10-2011-0069080 on Nov. 21, 2012 with English translation, 15 pages.
Office Action issued in Japanese Application No. 2013-518286, dated Feb. 17, 2014, 8 pages.
Office Action issued in Chinese Patent Application No. 201180034485.0 on Mar. 19, 2014 along with English translation, 21 pages.
Office Action issued in Taiwan Patent Application No. 100124952 on Jul. 30, 2013 with English translation, 10 pages.
Office Action issued in Taiwan Patent Application No. 100124952 on Dec. 5, 2013 with English translation, 7 pages.
Second Office Action issued in Chinese Patent Application No. 201180034485.0 on Jan. 12, 2015 along with English translation, 21 pages.
Office Action issued by the Japanese Patent Office in corresponding Application No. 2013-518286, dated Dec. 15, 2014, along with English translation, 16 pages.
Office Action issued by the Taiwanese Patent Office in corresponding Application No. 100124952, dated Dec. 26, 2014, along with English translation, 20 pages.

\* cited by examiner

*Primary Examiner* — Cynthia Hamilton
(74) *Attorney, Agent, or Firm* — Rothwell, Figg, Ernst & Manbeck, P.C.

(57) ABSTRACT

The present invention relates to a positive type photosensitive resin composition and an organic light emitting device black bank comprising the same, and more particularly, an organic light emitting device black bank comprising the photosensitive resin composition according to the exemplary embodiment of the present invention may further have a function of a black matrix without an additional process, such that it is possible to simplify a manufacturing process of the organic light emitting device and largely improve visibility.

13 Claims, 1 Drawing Sheet

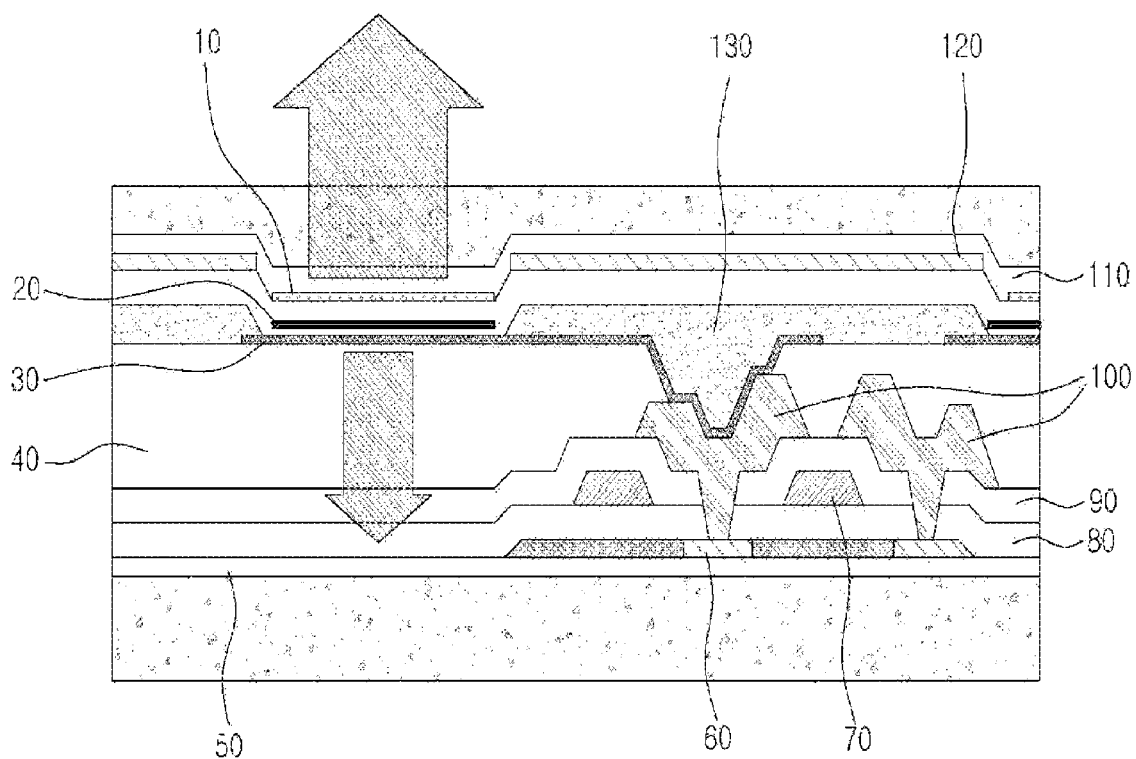

POSITIVE-TYPE PHOTOSENSITIVE RESIN COMPOSITION AND BLACK BANK OF AN ORGANIC LIGHT-EMITTING DEVICE INCLUDING SAME

TECHNICAL FIELD

The present invention relates to a positive type photosensitive resin composition and an organic light emitting device black bank comprising the same, and more particularly, to a positive type photosensitive resin composition that can implement stable and high sensitivity and an organic light emitting device black bank comprising the same. This application is a 35 U.S.C. §371 National Phase Entry Application from PCT/KR2011/005106, filed Jul. 12, 2011, and designating the United States, which claims priority under 35 U.S.C. §119 from Korean Patent Application Nos. 10-2010-0067919 and 10-2010-0067852 filed on Jul. 14, 2010 in the KIPO, the disclosure of which is incorporated herein by reference in its entirety.

BACKGROUND ART

A bank in an organic light emitting device functions to specify a shape of a pixel by forming a polyimide insulation layer in every other area except for a region in which an organic light emitting material will be deposited and act as the pixel, and allows each pixel to be electrically independently driven. In this case, the positive type photosensitive polyimide (PSPI) is used.

When the organic light emitting device is driven, in particular, a scattering phenomenon by light in mobiles used outdoors decreases visibility. In order to improve this problem, an effort for improving the visibility by absorbing scattered light by providing a separate black matrix (BM) as shown in FIG. 1 has been made. However, to this end, since a process for coating and patterning a separate layer is added, there are problems in that the process becomes complicated, cost and time are increased, and efficiency of the process is decreased.

Accordingly, in the art, a study for a photosensitive resin composition that can improve visibility of an organic light emitting device and stably manufacture a bank of the organic light emitting device is required.

DISCLOSURE

Technical Problem

The present invention has been made in an effort to provide a photosensitive resin composition that can improve visibility of an organic light emitting device, and act as a bank and a black matrix of the organic light emitting device.

The present invention has been made in an effort to provide an organic light emitting device black bank comprising the photosensitive resin composition.

Technical Solution

An exemplary embodiment of the present invention provides a positive type photosensitive resin composition comprising:

1) a polyimide-based resin that is represented by the following Formula 1,
2) a photoactive compound (PAC) or a photoacid generator (PAG),
3) a pigment or a dye, and
4) an organic solvent:

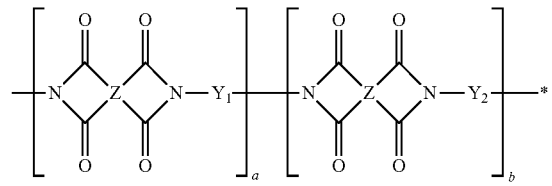

[Formula 1]

wherein,

Zs are each independently a tetravalent organic group derived from an acid anhydride or a derivative thereof, $Y_1$ and $Y_2$ are each independently a divalent organic group derived from a diamine or a derivative thereof, and a and b are each independently 2 to 500.

Another exemplary embodiment of the present invention provides an organic light emitting device black bank comprising the photosensitive resin composition.

Yet another exemplary embodiment of the present invention provides a method for manufacturing an organic light emitting device black bank, comprising:

1) coating the photosensitive resin composition on a substrate,
2) patterning the coated photosensitive resin composition by exposing and developing, and
3) curing the patterned photosensitive resin composition.

Still another exemplary embodiment of the present invention provides an organic light emitting device comprising the photosensitive resin composition.

Advantageous Effects

According to the exemplary embodiments of the present invention, a positive type photosensitive resin composition may have high sensitivity. In addition, an organic light emitting device black bank comprising the photosensitive resin composition according to the exemplary embodiment of the present invention may further have a function of a black matrix without an additional process, such that it is possible to largely improve visibility of the organic light emitting device.

BRIEF DESCRIPTION OF DRAWINGS

FIG. 1 is a view that illustrates a known organic light emitting device structure.

DESCRIPTION OF REFERENCE NUMERALS OF THE DRAWINGS

10: Cathode
20: Light emitting layer
30: Anode
40: Passivation layer (planarization layer)
50: $SiO_2$ barrier
60: Polysilicon
70: Gate
80: GI($SiO_2$)
90: ILD($SiO_2$)
100: Source/drain
110: Inorganic overcoat layer
120: Black matrix
130: Organic insulation layer (bank layer)

BEST MODE

Hereinafter, the present invention will be described in detail.

A positive type photosensitive resin composition according to the exemplary embodiment of the present invention comprises 1) a polyimide-based resin represented by Formula 1 above, 2) a photoactive compound (PAC) or a photoacid generator (PAG), 3) a pigment or a dye, and 4) an organic solvent.

In the photosensitive resin composition according to the exemplary embodiment of the present invention, as 1) the polyimide-based resin, a soluble polyimide-based resin, and polyamic acids and polyamic acid esters that are a precursor type of the polyimides may be used.

More particularly, 1) the polyimide-based resin may be represented by the following Formula 1.

[Formula 1]

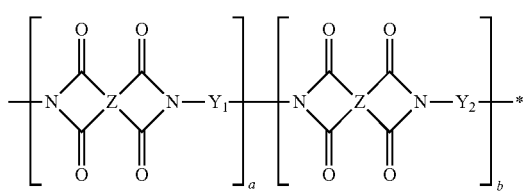

wherein,

Zs are each independently a tetravalent organic group derived from an acid anhydride or a derivative thereof, $Y_1$ and $Y_2$ are each independently a divalent organic group derived from a diamine or a derivative thereof, and a and b are each independently 2 to 500.

$Y_1$ and $Y_2$ of Formula 1 are each independently a divalent organic group derived from a diamine or a derivative thereof, $Y_1$ may be a divalent organic group comprising a hydroxy group, a phenolic hydroxy group or a carboxyl group, and $Y_2$ may be a divalent aliphatic or aromatic organic group, but they are not limited thereto.

More particularly, $Y_1$ of Formula 1 may be selected from the group consisting of the following Structural Formulas, or may be selected from the group consisting of the divalent organic groups derived from 3,5-diaminobenzoic acid.

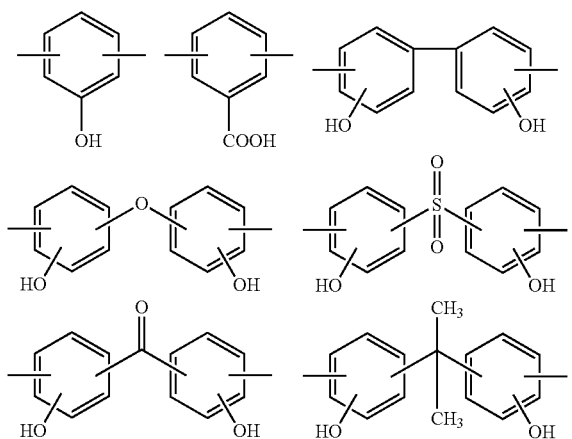

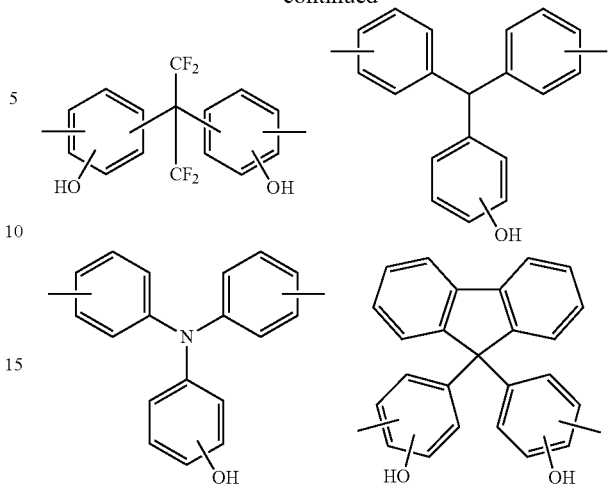

In addition, $Y_2$ of Formula 1 may be derived from a diamine used in manufacturing of a general polyimide-based polymer. As example of the diamine, there may be one or more of aromatic diamines that are selected from the group consisting of p-phenylenediamine, m-phenylenediamine, 2,4,6-trimethyl-1,3-phenylenediamine, 2,3,5,6-tetramethyl-1,4-phenylenediamine, 4,4'-diamino diphenyl ether, 3,4'-diamino diphenyl ether, 3,3'-diamino diphenyl ether, 4,4'-diaminodiphenylsulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis-(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, and 2,2-bis[4-(3-aminophenoxy)phenyl]propane; and one or more aliphatic diamines that are selected from the group consisting of 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, and 4,4'-diamino-3,3'-dimethyldicyclohexylmethane, and the aromatic and aliphatic diamines may be used while being mixed with each other, but are not limited thereto.

Zs of Formula 1 are each independently a tetravalent organic group derived from an acid anhydride or a derivative thereof, and more particularly, may be a tetravalent organic group derived from a tetracarboxylic acid dianhydride or a derivative thereof, but are not limited thereto.

As the tetracarboxylic acid dianhydride or the derivative thereof, there may be one or more acid anhydrides or the derivatives thereof selected from the group consisting of pyromellitic anhydride, 3,3',4,4'-biphenyltetracarboxylic acid dianhydride, 3,3',4,4'-benzophenonetetracarboxylic acid dianhydride, 3,3',4,4'-diphenylethertetracarboxylic acid dianhydride, 3,3',4,4'-diphenylsulfonetetracarboxylic acid dianhydride, 2,2-bis(3,4-dicarboxyphenyl)hexafluoroisopropylidene dianhydride, 3,3',4,4'-biphenyltetracarboxylic acid dianhydride, 4,4'-hexafluoroisopropylidenediphthalic acid anhydride, 3,3',4,4'-diphenylsulfonetetracarboxylic acid dianhydride, 1,2,3,4-cyclobutanetetracarboxylic acid dianhydride, 1,2-dimethyl-1,2,3,4-cyclobutanetetracarboxylic acid dianhydride, 1,2,3,4-tetramethyl-1,2,3,4-cyclobutanetetracarboxylic acid dianhydride, 1,2,3,4-cyclopentanetetracarboxylic acid dianhydride, 1,2,4,5-cyclohexanetetracarboxylic acid dianhydride, 3,4-dicarboxy-1,2,3,4-tetrahydro-1-naphthalene succinic acid dianhydride, 5-(2,5-dioxotetrahydrofuryl)-3-methyl-3-cyclohexene-1,2-dicarboxylic acid dianhydride, 2,3,5-tricarboxy-2-cyclopentane acetic acid dianhydride, bicyclo[2.2.2]octo-7-en-2,3,5,6-tetracarboxylic acid dianhydride, 2,3,4,5-tetrahydrofuranetetracarboxylic acid dianhydride, and 3,5,6-tricarboxy-2-norbornane acetic acid dianhydride. However, it is not limited thereto.

In the photosensitive resin composition according to the exemplary embodiment of the present invention, the polyimide-based resin has a characteristic showing high i-line permeability. In more detail, the i-line permeability of the polyimide-based resin may be 70% or more. In the case where the i-line permeability is less than 70%, an acid generation ratio by an i-line of PAC may be decreased, thus negatively affecting the resolution, which is not preferable. The resolution of the photosensitive resin is represented by an aspect ratio d/w that is ratio of a thickness d to a width w of the formed pattern, and in order to ensure the high resolution having the level of aspect ratio of 5, the i-line permeability may be at least 70% or more.

The measuring method of the i-line permeability is described below. The polyimide solution to be measured was spin coated on the glass substrate, and prebaked at 50 to 150° C. for 1 to 15 min, such that the solvent is volatilized, thus forming a prebaked film. In this case, the thickness of the coated film may be 1 to 4 μm. The permeability at 365 nm can be measured by using the UV spectrum by the glass substrate on which nothing is coated as the blank.

In addition, the weight average molecular weight of 1) the polyimide-based resin may be 1,000 to 100,000, and a glass transition temperature may be 150 to 400° C., but the weight average molecular weight and the glass transition temperature are not limited thereto.

In the photosensitive resin composition according to the exemplary embodiment of the present invention, the content of 1) the polyimide-based resin may be 1 to 30 wt % on the basis of the total weight of the photosensitive resin composition.

In particular, the photosensitive resin composition according to the exemplary embodiment of the present invention is characterized in that the curing is feasible at 150 to 250° C.

In the photosensitive resin composition according to the exemplary embodiment of the present invention, the photoactive compound (PAC) means a compound that has reactivity when light is incident thereto. In the exemplary embodiment of the present invention, the photoactive compound is not particularly limited, but a material that is widely used in the art may be used. In more detail, as the photoactive compound, a diazonaphthoquinone (DNQ) compound may be used, and the compound may be selected from the group consisting of compounds represented by the following Formula 2, but is not limited thereto.

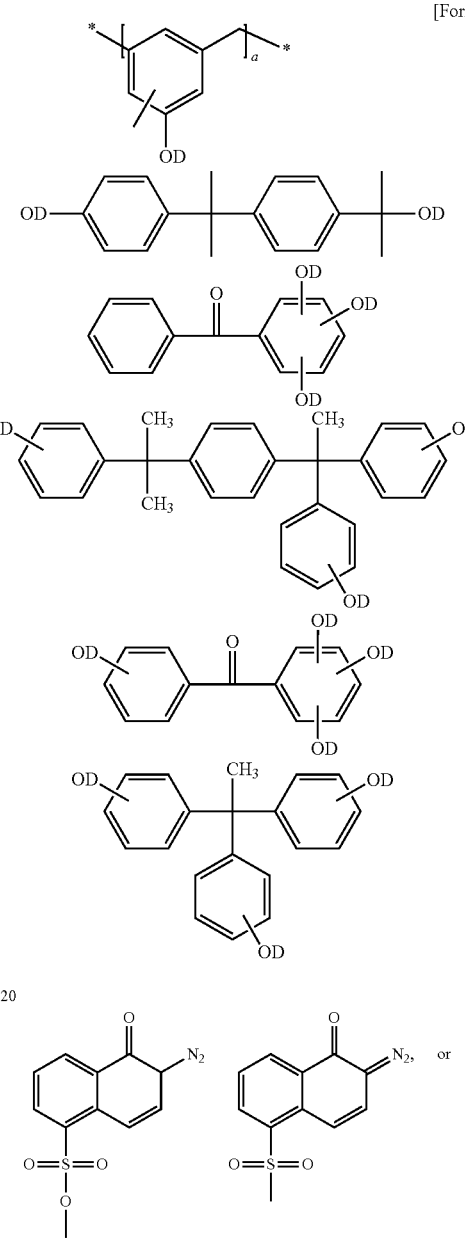

In the photosensitive resin composition according to the exemplary embodiment of the present invention, the photoacid generator (PAG) may comprise one or more of triarylsulfonium salts, diaryliodonium salts, sulfonates, sulfonium salts, and iodonium salts, but is not limited thereto.

In more detail, the photoacid generator (PAG) may be selected from the group consisting of triarylsulfonium triflate, diaryliodonium triflate, triarylsulfonium nonaflate, diaryliodonium nonaflate, succinimidyl triflate, 2,6-dinitrobenzyl sulfonate, and mixtures thereof.

The content of the photoactive compound (PAC) or photoacid generator (PAG) may be 0.5 to 30 wt % on the basis of the total weight of the composition, but is not limited thereto.

In the photosensitive resin composition according to the exemplary embodiment of the present invention, the pigment may use carbon black alone or a mixture of carbon black and two or more coloring pigments, but is not limited thereto.

As the carbon black, Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, Cisto VGPF, Cisto SVHSRF-HS, and Cisto SSRF manufactured by Donghae Carbon Co., Ltd.; Diagram black □, Diagram black N339, Diagram black SH, Diagram black H, Diagram LH, Diagram HA, Diagram SF, Diagram N550M, Diagram M, Diagram E, Diagram G, Diagram R, Diagram N760M, Diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, OIL7B, OIL9B, OIL11B, OIL30B, and OIL31B manufactured by Mitsubishi Chemical Co., Ltd.; PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 manufactured by Degussa Co., Ltd.; and RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 manufactured by Columbia Carbon Co., Ltd. may be used.

As the coloring pigment usable while being mixed with carbon black, there may be Carmin 6B (C.I.12490), Phthalocyanine GREEN (C.I. 74260), Phthalocyanine BLUE (C.I. 74160), Mitsubishi Carbon Black MA100, Perylene BLACK (BASF K0084. K0086), Cyanin BLACK, Linol YELLOW (C.I.21090), Linol YELLOW GRO (C.I. 21090), Benzidine YELLOW 4T-564D, Mitsubishi Carbon black MA-40, Victoria PURE BLUE (C.I.42595), C.I. PIGMENT RED 97, 122, 149, 168, 177, 180, 192, 215, C.I. PIGMENT GREEN 7, 36, C.I. PIGMENT 15:1, 15:4, 15:6, 22, 60, 64, C.I. PIGMENT 83, 139 and C.I. PIGMENT VIOLET 23, and further, a white pigment, and a fluorescent pigment may be used.

In particular, it is more preferable that the photosensitive resin composition according to the exemplary embodiment of the present invention comprises a dye. Since the dye has high heat resistance and UV permeability, it is possible to implement the stable and high sensitivity of the photosensitive resin composition. In more detail, since the dye has high heat resistance, a change of color is small in the high temperature firing process, and since the permeability is high in a UV region, it is possible to implement high sensitivity.

In addition, the dye should have a soluble characteristic to a general solvent in order to manufacture the composition. This dye may comprise one or more selected from the group consisting of a direct dye, an acidic dye, a basic dye, a dispersion dye, and a solvent dye. More particularly, as the dye, one or more dyes may be selected from acridine dyes, anthraquinone dyes, arylmethane dyes, diarylmethane dyes, triarylmethane dyes, azo dyes, diazonium dyes, nitro dyes, nitroso dyes, phthalocyanine dyes, quinone-imine dyes, azin dyes, eurhodin dyes, safranin dyes, indamins dyes, indophenol dyes, oxazin dyes, oxazone dyes, thiazin dyes, thiazole dyes, xanthene dyes, fluorene dyes, pyronin dyes, and rhodamine dyes.

In addition, the dye having a black color may be manufactured and used by using a black dye alone or a mixture of two or more dyes having different colors.

In particular, in the exemplary embodiment of the present invention, the dye having excellent characteristics such as solubility and heat resistance may be used, and one or more of an anthraquinone dye, an azo dye, and a phthalocyanine dye may be used.

In the photosensitive resin composition according to the exemplary embodiment of the present invention, the content of 3) the pigment or dye may be 2 to 30 wt % on the basis of the total weight of the photosensitive resin composition.

In the photosensitive resin composition according to the exemplary embodiment of the present invention, 4) the organic solvent may comprise one or more of N,N-dimethylformamide, N,N-dimethylacetamide, N-methylpyrrolidone, N-vinylpyrrolidone, N-methylcaprolactam, dimethylsulfoxide, tetramethylurea, pyridin, dimethylsulfone, hexamethylsulfoxide, m-cresol, γ-butyrolactone, ethylcellosolve, butylcellosolve, ethylcarbitol, butylcarbitol, ethylcarbitol acetate, butylcarbitol acetate, ethyleneglycol, propyleneglycol monomethyl ether acetate (PGMEA), lactic acid ethyl, lactic acid butyl, cyclohexanone, cyclopentanone, acetone, methyl ethyl ketone, methyl isobutyl ketone, methylcellosolve, tetrahydrofurane, 1,4-dioxane, ethyleneglycol dimethyl ether, ethyleneglycol diethyl ether, propyleneglycol dimethyl ether, propyleneglycol diethylether, diethyleneglycol dimethylether, diethyleneglycol diethylether, diethyleneglycol methyl ethyl ether, chloroform, chloromethylene, 1,2-dichloroethane, 1,1,1-trichloroethane, 1,1,2-trichloroethane, 1,1,2-trichloroethene, hexane, heptane, octane, cyclohexane, benzene, toluene, xylene, methanol, ethanol, isopropanol, propanol, butaneol, t-butaneol, 2-ethoxy propanol, 2-methoxy propanol, 3-methoxy butaneol, cyclohexanone, cyclopentanone, propeleneglycol ethyl ether acetate, 3-methoxybutyl acetate, ethyl 3-ethoxypropionate, ethyl cellosolveacetate, methyl cellosolveacetate, butyl acetate, dipropyleneglycol monomethyl ether.

The content of 4) organic solvent may be 50 to 97 wt % on the basis of the total weight of the photosensitive resin composition, but is not limited thereto.

The photosensitive resin composition according to the exemplary embodiment of the present invention may further comprise one or more additives selected from a solution speed controlling agent, a sensitizing agent, an attachment strength promoting agent, and a surfactant.

As the attachment strength promoting agent, one or more selected from the group consisting of vinyltrimethoxysilane, vinyltriethoxysilane, vinyltris(2-methoxyethoxy)-silane, N-(2-aminoethyl)-3-aminopropylmethyldimethoxysilane, N-(2-aminoethyl)-3-aminopropylmethyltrimethoxy silane, 3-aminopropyltriethoxysilane, 3-glycidoxypropyltriethoxysilane, 3-glycidoxypropylmethyldimethoxysilane, 2-(3,4-ethoxy cyclohexyl)ethyltrimethoxysilane, 3-chloropropyl methyldimethoxysilane, 3-chloropropyl trimethoxy silane, 3-methacryloxypropyltrimethoxysilane, and 3-mercaptopropyltrimethoxysilane may be used. In addition, the attachment strength promoting agent is not limited thereto, but an attachment strength promoting agent that is known in the art may be used.

The content of the additive may be 0.1 to 10 wt % on the basis of the total weight of the photosensitive resin composition, but is not limited thereto.

The photosensitive resin composition according to the exemplary embodiment of the present invention may have high heat stability and reliability and high sensitivity.

In particular, the photosensitive resin composition according to the exemplary embodiment of the present invention is characterized in being patterned in a positive type.

Another exemplary embodiment of the present invention provides an organic light emitting device black bank comprising the photosensitive resin composition.

The organic light emitting device black bank according to the exemplary embodiment of the present invention may further have a function of a black matrix without an additional process, such that it is possible to largely improve visibility of the organic light emitting device.

The organic light emitting device black bank may implement a low taper angle. In more detail, the taper angle of the organic light emitting device black bank may be 50° or less and preferably 30° or less, but is not limited thereto.

In addition, a method for manufacturing an organic light emitting device black bank according to the exemplary embodiment of the present invention comprises 1) coating the photosensitive resin composition on a substrate, 2) patterning the coated photosensitive resin composition by exposing and developing, and 3) curing the patterned photosensitive resin composition.

In the method for manufacturing the organic light emitting device black bank according to the exemplary embodiment of the present invention, step 1) is a step for coating the photosensitive resin composition, and for example, the resin composition may be coated on the substrate by using a method that is known in the art. In more detail, as the method for coating the photosensitive resin composition, a spray method, a roll coating method, a spin coating method, a bar coating method, a slit coating method, and an ink-jet coating method may be used, but the method is not limited thereto.

In this case, the substrate may use metal, paper, glass, plastic, silicon, polycarbonate, polyester, aromatic polyamide, polyamideimide, and polyimide, and in respect to these substrates, appropriate pretreatment such as chemical treatment by a silane coupling agent, plasma treatment, ion plating, sputtering, a vapor reaction method, and vacuum deposition may be performed for the purpose. In addition, a thin film transistor for driving may be disposed on the substrate, and a nitrated silicon film may be sputtered.

In the method for manufacturing the organic light emitting device black bank according to the exemplary embodiment of the present invention, step 2) is a step for exposing and developing the coated photosensitive resin composition.

In more detail, the pattern may be formed by irradiating UV through a predetermined pattern mask to a prebaked coat film and removing an unnecessary portion by developing the film in an alkaline aqueous solution. In this case, as the developing method, a dipping method and a shower method may be applied without limit. A developing time is generally about 30 to 180 sec. As the developing solution, as an alkaline aqueous solution, inorganic alkalines such as sodium hydroxide, potassium hydroxide, sodium silicate, methsodium silicate, and ammonia; primary amines such as ethylamine, N-propylamine; secondary amines such as diethylamine and di-n-propylamine; tertiary amines such as trimenylamine, methyldiethylamine, and dimethylethylamine; tertiary alcohol amines such as dimethylethaneolamine, methyldiethaneolamine, and triethaneolamine; tertiary cycloamines such as pyrrole, piperidine, n-methylpiperidine, n-methylpyrrolidine, 1,8-diazabicyclo[5.4.0]-7-undecene, 1,5-diazabicyclo[4.3.0]-5-nonene; tertiary aromatic amines such as pyridine, colizine, lutidine, and quirroline; and an aqueous solution of quaternary ammonium salts such as tetramethylammoniumhydroxide and tetraethylammoniumhydroxide may be used.

After the developing, water washing is performed for about 30 to 90 sec, and drying is performed with air or nitrogen, thereby forming the pattern. This pattern may be post-baked by using a heating device such as a hot plate and an oven, thereby obtaining a final photosensitive material pattern. In this case, the post-baking may be performed at 150 to 250° C. for about 10 to 90 min.

Still another exemplary embodiment of the present invention provides an organic light emitting device comprising the photosensitive resin composition.

The organic light emitting device according to the exemplary embodiment of the present invention may be manufactured by using a material and a method that are known in the art, except that the diode comprises a bank manufactured from the photosensitive resin composition.

[Mode for Invention]

Hereinafter, the present invention will be described in detail through Examples.

Examples according to an exemplary embodiment of the present invention are set forth to explain the invention in more detail, many modifications thereof may be possible in addition to the following Examples, and the scope of the present invention is not limited to the following Examples.

EXAMPLE

Synthesis Example 1

Preparation of Polyimide Represented by Formula 1

11.0 g of 2,2-bis(3-amino-4-hydroxyphenyl)hexafluoropropane and 40 g of γ-butyrolactone were sequentially added to 100 mL round bottom flask, and completely dissolved by slowly agitating them, and 5.9 g of butane-1,2,3,4-tetracarbonic acid dianhydride was slowly added thereto while the flask was maintained at room temperature by the water bath. The mixture solution was agitated at room temperature for 16 hours, 7 g of toluene was put thereinto, setting was performed so that water was removed through the dean-stark distillation device, and reflux was performed at 140° C. for 3 hours. This solution was cooled to room temperature, slowly poured to the mixture solution in which methanol:water is 1:4, solidified, and dried in the vacuum dry oven at 40° C. for one day, thus obtaining 14 g of the polyimide resin.

Through IR, the polyimide generation peak was confirmed, the weight average molecular weight of the polyimide resin measured through GPC was 40,000, and the poly disperse index (PDI) was 1.5.

Example 1

Manufacturing of the Photosensitive Resin Composition (Black Dye Composition)

0.5 g of diazonaphthoquinone ester compound (TPPA 320: OH and OD were selectively provided according to the ratio of OD/(OD+OH)=2/3) as the photoactive compound, 0.4 g of azo black dye, and 7 g of solvent γ-butyrolactone (GBL) were added to 1.6 g of the soluble polyimide that was synthesized in Synthetic Example 1, agitated at room temperature for 1 hour, and filtered by the filter having the pore size 1 μm, thereby manufacturing the photosensitive resin composition.

Example 2

Manufacturing of the Photosensitive Resin Composition (Black Pigment Composition)

0.5 g of diazonaphthoquinone ester compound (TPPA 320: OH and OD were selectively provided according to the ratio of OD/(OD+OH)=2/3) as the photoactive compound, 0.5 g of carbon black pigment, and 7 g of solvent γ-butyrolactone (GBL) were added to 1.6 g of the soluble polyimide that was synthesized in Synthetic Example 1, agitated at room temperature for 1 hour, and filtered by the filter having the pore size 1 μm, thereby manufacturing the photosensitive resin composition.

Comparative Example 1

Manufacturing of the Photosensitive Resin Composition (Polyimide Composition)

0.5 g of diazonaphthoquinone ester compound (TPPA 320: OH and OD were selectively provided according to the ratio of OD/(OD+OH)=2/3) as the photoactive compound, and 5 g of solvent γ-butyrolactone (GBL), were added to 1.6 g of the soluble polyimide that was synthesized in Synthetic Example 1, agitated at room temperature for 1 hour, and filtered by the filter having the pore size 1 μm, thereby manufacturing the photosensitive resin composition.

Experimental Example

1) Evaluation of Photosensitivity

The photosensitive film having the thickness of 1.3 μm was formed by spin coating the photosensitive resin composition manufactured in Examples 1 to 2 and Comparative Example 1 on the 4 inch silicon wafer, and heating the composition on the hot plate at 120° C. for 2 min. The preheated silicon wafer was closely contacted with the photomask under the vacuum, and sequentially exposed by the G-line stepper Nikon NSR 1505 G4 from 20 mJ/cm$^2$ to 700 mJ/cm$^2$ at an interval of 5 mJ/cm$^2$. After the developing in 2.38 wt % hydroxylated tetramethylammonium aqueous solution at 23° C. for 80 sec, washing and drying were performed with ultrapure water for 60 sec, thereby obtaining the pattern in which the non-exposed portion clearly remains. As described above, the patterned silicon wafer was slowly heated under the nitrogen atmosphere on the hot plate from room temperature to 250° C. for about 60 min, and maintained at 250° C. for 30 min while being heat treated.

The film that was manufactured from the compositions of Examples 1 and 2 had the thickness of 1.0 μm and the minimum line width of the pattern of 5 μm, which showed excellent resolution. Example 1 using the dye showed higher sensitivity and taper angle, but it was confirmed that the OD value was low. It could be seen that the composition of Comparative Example 1 was the composition in which the dye or pigment was put, and had the very high sensitivity. The above results are shown in the following Table 1.

TABLE 1

| | OD (Optical density) | Sensitivity (mJ/cm$^2$) | Taper angle (°) |
|---|---|---|---|
| Example 1 | 1.5 | 450 | 30 |
| Example 2 | 2.1 | 650 | 35 |
| Comparative Example 1 | 0 | 25 | 30 |

From the above results, it can be seen that a positive type photosensitive resin composition according to the exemplary embodiment of the present invention may have high sensitivity. In addition, an organic light emitting device black bank comprising the photosensitive resin composition according to the exemplary embodiment of the present invention may further have a function of a black matrix without an additional process, such that it is possible to largely improve visibility of the organic light emitting device. That is, in the exemplary embodiment of the present invention, since the organic insulation layer (bank layer) 130 in the following FIG. 1 also have a function of a black matrix 120, a separate process for implementing the black matrix 120 is not required.

The invention claimed is:

1. A positive type photosensitive resin composition comprising:
    1) a polyimide-based resin that is represented by the following Formula 1,
    2) a photoactive compound (PAC) or a photoacid generator (PAG),
    3) a black pigment or a black dye, and
    4) an organic solvent:

[Formula 1]

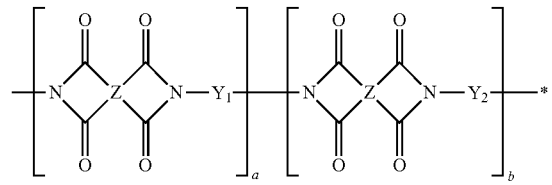

wherein,

Zs are each independently a tetravalent organic group derived from an acid anhydride or a derivative thereof, $Y_1$ is a divalent organic group derived from a diamine or a derivative thereof and, $Y_1$ comprises one or more selected from the group consisting of the following Structural Formulas,

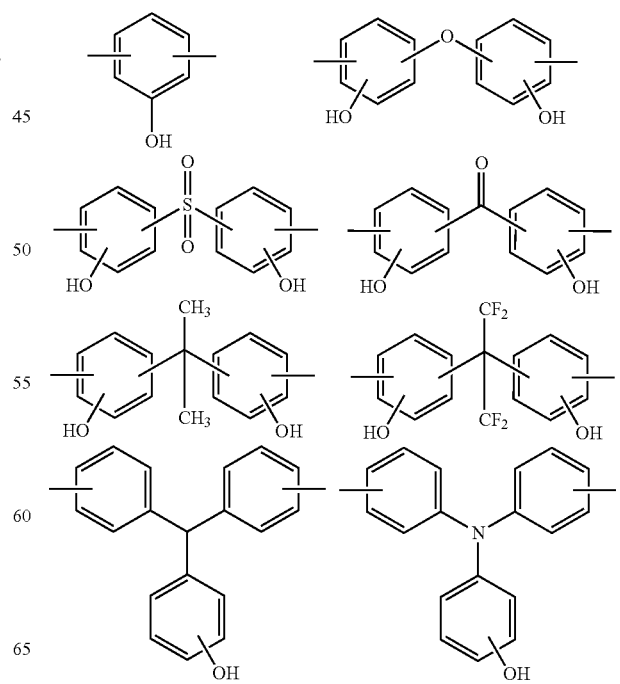

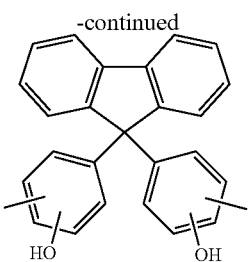

Y₂ is a divalent aliphatic or aromatic organic group derived from a diamine or a derivative thereof, and a and b are each independently 2 to 500, and wherein the photoactive compound comprises one or more selected from the compounds that are represented by the following Formula 2:

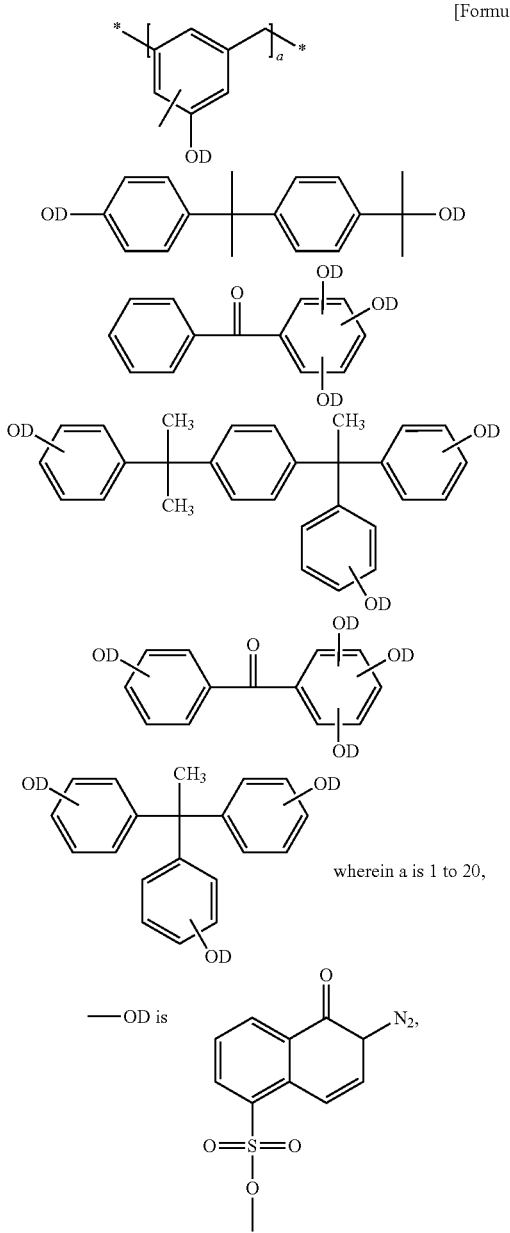

[Formula 2]

wherein a is 1 to 20,

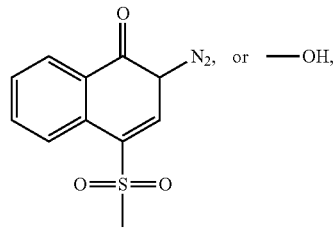

and wherein on the basis of a total weight of the photosensitive resin composition, the content of 1) the polyimide-based resin is 1 to 30 wt %, the content of 2) the photoactive compound (PAC) or photoacid generator (PAG) is 0.5 to 30 wt %, the content of 3) the pigment or dye is 2 to 30 wt %, and the content of 4) the organic solvent is 50 to 97 wt %.

2. The positive type photosensitive resin composition according to claim 1, wherein Zs of Formula 1 are each independently a tetravalent organic group derived from a tetracarboxylic acid dianhydride or a derivative thereof.

3. The positive type photosensitive resin composition according to claim 1, wherein an i-line permeability of 1) the polyimide-based resin is 70% or more.

4. The positive type photosensitive resin composition according to claim 1, wherein a weight average molecular weight of 1) the polyimide-based resin is 1,000 to 100,000, and a glass transition temperature is 150 to 400° C.

5. The positive type photosensitive resin composition according to claim 1, wherein the photoacid generator (PAG) comprises one or more selected from the group consisting of triarylsulfonium salts, diaryliodonium salts, sulfonates, sulfonium salts and iodonium salts.

6. The positive type photosensitive resin composition according to claim 1, wherein the black pigment comprises carbon black alone, or a mixture of carbon black and two or more coloring pigments.

7. The positive type photosensitive resin composition according to claim 1, wherein the black dye comprises a black dye alone, or a mixture of two or more dyes having different colors.

8. The positive type photosensitive resin composition according to claim 1, wherein the photosensitive resin composition further comprises one or more additives selected from the group consisting of a solution speed controlling agent, a sensitizing agent, an attachment strength promoting agent, and a surfactant.

9. The positive type photosensitive resin composition according to claim 8, wherein the content of the additive is 0.1 to 10 wt % on the basis of the total weight of the photosensitive resin composition.

10. A method for manufacturing an organic light emitting device black bank, comprising:
  1) coating the photosensitive resin composition according to claim 1 on a substrate,
  2) patterning the coated photosensitive resin composition by exposing and developing, and
  3) curing the patterned photosensitive resin composition.

11. An organic light emitting device black bank comprising:
  the positive type photosensitive resin composition according to claim 1.

12. The organic light emitting device black bank according to claim 11, wherein a taper angle of the organic light emitting device black bank is 50° or less.

13. An organic light emitting device comprising:
the positive type photosensitive resin composition according to claim 1.

\* \* \* \* \*